United States Patent [19]
Rajan et al.

[11] Patent Number: 5,638,005
[45] Date of Patent: Jun. 10, 1997

[54] PREDICTIVE WAVEFORM ACQUISITION

[75] Inventors: Suresh N. Rajan, San Jose; Kenichi Kanai, Palo Alto, both of Calif.

[73] Assignee: Schlumberger Technologies Inc., San Jose, Calif.

[21] Appl. No.: 488,650

[22] Filed: Jun. 8, 1995

[51] Int. Cl.$^6$ .............................. G01R 31/78; G01R 31/02
[52] U.S. Cl. ........................................ 324/751; 324/73.1
[58] Field of Search ................................. 324/73.1, 751, 324/754, 755, 756, 757

[56] References Cited

U.S. PATENT DOCUMENTS

| | | | |
|---|---|---|---|
| 4,771,235 | 9/1988 | Brust | 324/751 |
| 4,820,977 | 4/1989 | Brust | 324/751 |
| 4,887,031 | 12/1989 | Brust | 324/751 |
| 5,144,225 | 9/1992 | Talbot | 324/73.1 |
| 5,210,487 | 5/1993 | Takahashi et al. | 324/71.3 |

*Primary Examiner*—Kenneth A. Wieder
*Assistant Examiner*—Barry C. Bowser
*Attorney, Agent, or Firm*—Bruce D. Riter

[57] ABSTRACT

A tester exercises a DUT with a repetitive signal pattern, supplying a trigger signal for each repetition. The waveform on a conductor of the DUT is to be acquired by repeatedly measuring voltage at each of a number of sample points following the trigger, using a charged-particle probe system having an integrator-filter loop for analyzing energy of secondary particles. Before measurement at a sample point, integrator is reset and the filter voltage needed to settle the loop for the sample point is set using a predictive scheme. When the measurement is made, the predicted filter voltage is summed with the integrator output voltage to produce the actual filter voltage. The integrator then measures the error between the predicted filter voltage and the actual filter voltage needed to settle the loop. The time needed to settle the loop is thereby minimized. Various predictive schemes can be used. An adaptive predictive scheme uses the error measured by the integrator to update the filter voltage prediction for the next measurement at the same sample point. The predicted filter voltage can be a previous measurement or an average of previous measurements taken at that sample point or an average of previous measurements taken over some time interval or a value determined by any other desired predictive scheme.

30 Claims, 13 Drawing Sheets

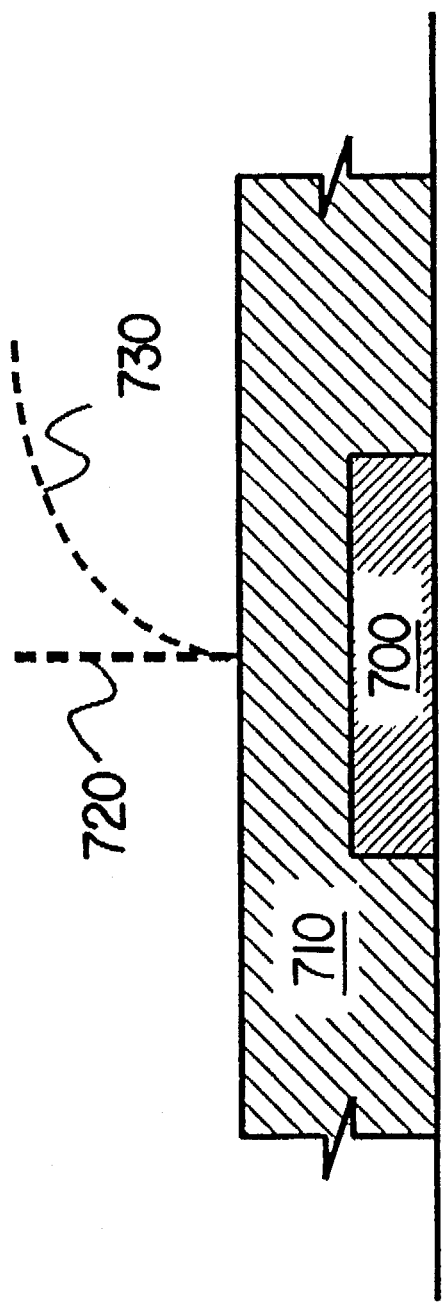
FIG. 7
FIG. 8B
FIG. 8A

PREDICTIVE WAVEFORM ACQUISITION

BACKGROUND OF THE INVENTION

1. Field of the Invention

The present invention relates to methods and apparatus for acquisition of signal information from a circuit using a particle-beam prober, particularly an electron-beam prober.

2. The Prior Art

FIG. 1 shows a prior art electron beam test probe system 10 having an electron beam test probe 12, a circuit exerciser 14, and a data processing system 16 with display terminal 18. Circuit exerciser 14 is a conventional integrated circuit tester which can repeatedly apply a pattern of test vectors to a specimen circuit 26 over a bus 24 (such as a model 9000 tester available from Schlumberger Technologies, Inc. of San Jose, Calif.). The specimen circuit 26 (device under test, or DUT) is placed in test probe 12 so that samples of voltages on nodes of the DUT can be acquired as the test vector pattern is applied. Processing system 16 communicates with circuit exerciser 14, and with test probe 12 over bus 22, to specify the test vector pattern and timing of the sample points relative to the test vector pattern. System 10 is controlled by operator commands through display terminal 18.

Test probe 12 has a SEM column with beam blanker for directing electron-beam pulses at a DUT node of interest in a mode of operation much like that of a sampling oscilloscope. The waveform on one or more nodes of interest can be sampled and an image produced as the DUT is exercised. The images can be qualitative (e.g., logic state maps for digital circuit debug) or, with a secondary-electron energy analyzer, quantitative (e.g., analog signal waveforms).

For each point of the waveform image, the electron beam is pulsed at a specific time during application of the test vector pattern to the DUT. Each time the beam is pulsed, the potential on a node of the DUT is sampled. As one sample is not statistically accurate enough for accurate measurement of the potential, samples acquired over many repetitions of the pattern are averaged. The pulses are coordinated with the test vector pattern by a trigger generator circuit under control of data processing system 16.

FIG. 2 is a partial functional diagram of an electron beam test probe system configured to acquire waveform images. Timing controller 30 receives a trigger signal from tester 14 and supplies beam-pulse timing signals to the electron-optics of test probe 12. Potential-sample signals from test probe 12 are digitized by analog-to-digital converter (ADC) 32 under control of a timing signal synchronized with the beam pulse timing signals, and supplied to one input of an arithmetic logic unit (ALU) 34. A second input of ALU 34 receives data from a data buffer 36. ALU 34 returns the weighted sum of the two input values to data buffer 36 under control of data buffer address controller 38. Controller 38 communicates with timing controller 30, and with processor 40 via communication interface 42. Controller 38 keeps track of which data relates to which point in the waveform when such data is stored in data buffer 36 so that the data can be composed as a waveform image for display.

The desired waveform image is to be composed of values at n sample points during the test vector pattern. Each sample point is assigned an address in data buffer 36. The timing diagram of FIG. 3 shows a trigger signal pulse 340 from tester 14 which causes timing control circuit 30 to supply a beam pulse 342 to test probe 12 at delay $t_1$ following trigger pulse 340. When a succeeding trigger pulse 344 is produced by tester 14, timing control circuit 30 produces a beam pulse 346 at delay $t_1$ after trigger pulse 344. Each trigger pulse (340, 344, etc.) typically represents one repetition of the test vector pattern applied to the DUT. Samples are repeatedly acquired at a delay $t_1$ following the trigger pulses until enough pulses are acquired and averaged to give a meaningful measurement at that sample point. The process is repeated for a second sample point at delay $t_2$, for a third sample point at delay $t_3$, and so on through an nth sample point at delay $t_n$. This may require thousands of test vector pattern repetitions for each sample point in the waveform and hundreds of thousands of repetitions to acquire the waveform image.

Acquisition time can be reduced as shown in FIG. 4 by acquiring multiple samples during each test vector pattern repetition. At time $t_1$ following trigger pulse 450, beam pulse 452 is produced. Further beam pulses 454, 456, etc., are produced at an interval m·dt following pulse 452, where m is an integer and dt represents the time interval between points in the desired waveform. In this example, m=4, so the waveform is sampled at one fourth (1/m) of the sample points with each test pattern repetition. When enough samples have been averaged for these sample points, the beam pulses are retarded by a time dt such that the first beam pulse 460 follows a trigger pulse by a time $t_2=t_1+dt$. Samples are acquired and averaged for an additional one fourth of the sample points with each test pattern repetition. The process is repeated for a delay $t_3=t_2+dt$ and a delay $t_4=t_3+dt$ to acquire and average samples for the remaining sample points of the waveform. Implementation is further described in U.S. Pat. No. 5,144,225, the content of which is incorporated herein by this reference.

FIG. 5 schematically illustrates prior-an acquisition of the waveform on a DUT 500. As primary electron beam 505 is directed at the DUT, secondary electrons 510 are detected by a detector 515 which supplies a secondary electron current Isec. Current Isec varies non-linearly with changes in the surface potential Vdut on DUT 500. A feedback loop comprising of a difference amplifier 520, reference current source 535, gated integrator 525 and filter mesh 530 is employed to linearize the relationship between Isec and Vdut. Difference amplifier 520 generates an error signal Iint whose amplitude depends on the difference between Isec and the reference current Iref from constant current source 535. The error signal is passed through controlled gate 540 to capacitor 545 and amplifier 550 of integrator 525. Integrator 525 supplies a voltage Vfilter to filter mesh 530. The number of electrons with sufficient energy to overcome the potential barrier of the filter mesh is governed by the difference between DUT voltage Vdut and filter voltage Vfilter. When Vdut changes, the feedback loop acts to make the same number of electrons overcome the potential barrier (i.e., keep Isec constant) by varying Vfilter. This condition is achieved if the change in filter voltage is the same as the change in the DUT voltage. That is, the filter voltage tracks (with a fixed offset) variations in Vdut. Gate 540 is closed once during each beam-pulse interval.

Assume for example that Vdut=0 V, Vfilter=−7 V and the loop is settled (Isec=Iref) at a given sample point. Let Vdut be +5 V at the next sample point. Vfilter will go from being −7 V with respect to Vdut to being −12 V with respect to Vdut, and fewer number of electrons will have sufficient energy to overcome the filter potential barrier. Isec will thus be smaller than Iref, and this imbalance will cause an error current Iint to flow out of the integrator. Error-current Iint reduces the charge stored in the integrator's capacitor, and the integrator output becomes more positive. This change in Vfilter lowers the potential barrier for the secondary electrons, thereby increasing Isec, which will in turn Vfilter more positive. The loop will eventually settle when Vfilter =−2 V. That is, when Vdut changes from 0 V to +5 V, Vfilter changes from −7 V to −2 V (a +5 V change) to settle the loop.

The loop settling time depends on the magnitude of the change in Vfilter needed to settle the loop. Since, I=C * (ΔV/ΔT), the loop settling time can be written as ΔT=(C * ΔV)/I. Isec depends on the width of the sampling-beam pulse. Typically, Iint=Isec−Iref is a very small current and is insufficient to change the filter voltage appreciably. Multiple sampling-beam pulses are therefore needed to drive the filter voltage to the final value. Thus, the smaller the sampling-beam pulse-width, the more sampling-beam pulses are needed per measurement. For example, for a 1 nanosecond pulse-width, 1000 sampling-beam pulses may be needed to settle the loop, while 3500 sampling-beam pulses may be needed for a 200 ps pulse-width. The current needed to settle the loop, I=Iint* J, where J is the number of sampling-beam pulses per measurement. The time needed to make a voltage measurement (loop settling time) increases for a larger change in Vfilter from one measurement to the next, and decreases for a smaller change in Vfilter from one measurement to the next. The loop settling time increases when a larger capacitor is used and decreases when a smaller capacitor is used. Further, the loop settling time decreases when fewer sampling-beam pulses are used per measurement and increases when more sampling-beam pulses are used per measurement. A large capacitor and a large number of sampling-beam pulses per measurement allow for a low-noise but slower measurement of the DUT voltage. A faster and noisier measurement can be achieved by using a smaller capacitor and fewer sampling-beam pulses per measurement. A typical approach is to compromise between low noise and fast loop settling.

Measurement of Vdut as described above is typically repeated at a plurality of delays (t1, t2, ..., tm) from the trigger to obtain a waveform image or sweep. Such measurements are typically noisy. The noise is usually random in nature and can be reduced by obtaining many sweeps and averaging the results. For example, N sweeps may be made, each sweep consisting of M measurements. The N samples at delay t1 may be averaged and the result displayed as the voltage measurement at delay t1. This is repeated for the measurements at delays t2, t3, ..., tm.

There are two ways to obtain a sweep: linear and random. FIG. 3 is an example of the linear mode, in which the delay between the trigger and successive sample points is linearly incremented by a fixed interval. FIG. 6 illustrates the succession of sample points ① through ⑨ in a linear-mode sampling scheme. The DUT voltage Vdut is measured at the first delay from the trigger to sample point (sample point ①), then Vdut is measured at a second delay from the trigger to the sample point (sample point (②)), etc. The change in Vdut from one sample point to the next sample point is usually not large. That is, Vdut at sample point ② is not much different from Vdut at the previous sample point ((①)) or the successive sample point ③. For a given sampling-beam pulse-width and capacitor size, linear sampling requires fewer sampling-beam pulses per measurement to settle the loop than does random sampling. For this reason, linear sampling mode is the faster of the two modes.

Random mode sampling is typically used to measure DUT voltage changes for passivated devices or when measuring voltage changes on conductors buried under a dielectric layer. FIGS. 7–9 show why. In FIG. 7, conductor 700 is buried under a dielectric layer 710. A pulsed electron-beam 720 produces secondary electrons 730. When the actual waveform on conductor 700 is switched between high and low voltages as in FIG. 8A, the measured waveform is distorted as in FIG. 8B due to capacitive coupling between conductor 700 and the surface of dielectric 710. FIG. 9 shows an equivalent circuit in which voltage source 900 represents conductor 700, capacitor 910 represents dielectric 710, switch 920 represents (when closed) an electron-beam pulse, and resistor 940 represents a path for leakage of charge from dielectric 710. Because many samples are needed for a useful measurement at a given sample point, the sampling rate is kept as high as possible to minimize waveform acquisition time. But since dielectric 710 charges up each time sampling beam 720 hits the DUT, a high sampling rate using the linear sampling mode does not allow time for the charge to dissipate.

In random mode sampling, the delay between the trigger and the successive sample points is changed in a pseudo-random or random manner. FIG. 10 illustrates, with sample points ① through ⑨ arranged in pseudo-random or random order. For example, a first sample is taken at some delay from trigger to sample point (sample point ①), then a second sample is taken at a different delay from trigger to sample point (sample point ②), etc. Since the delay between the trigger and successive sample points is varied in a random or pseudo-random manner, there is a high probability that the change in Vdut between successive samples can be equal to the maximum change in Vdut (for example, Vdut changes by the maximum amount between sample points ① and ② in FIG. 10). Since the filter voltage Vfilter has to track the change in Vdut, the loop settling time is large in random sampling mode. If the capacitor used is the same as in linear mode, then more sampling-beam pulses are needed per measurement (longer loop settling time) for random mode. If a smaller capacitor is used without changing the number of sampling-beam pulses per measurement, noise increases. Typically, a combination of a smaller capacitor and an increased number of samples is used for random mode. For example, for a 1 nanosecond beam pulse width, the number of samples is increased from 1000 in linear mode to 2000 in random mode, and the capacitor is decreased from 2200 pF in linear mode to 1000 pF in random mode. In this example, random mode takes approximately 5 times longer than linear mode to reach a desired signal-to-noise ratio.

U.S. Pat. No. 5,210,487 shows (in FIG. 11 of the patent) a scheme in which the voltage of the filter grid Vfilter is produced by convening a measured-voltage signal to an analog voltage and summing this analog voltage with an offset voltage Voffset which sets the operating point of the filter grid. U.S. Pat. No. 5,210,487 shows (in FIG. 13 of the patent) a scheme in which the voltage of the filter grid Vfilter is produced by summing the measured-voltage signal from the integrator with an offset voltage Voffset which sets the operating point of the filter grid.

U.S. Pat. No. 5,144,225 shows (in FIG. 12 of the patent) a scheme in which a sampling circuit is operates as multiple loops in parallel. Each time a measurement is taken at a given delay following the trigger signal, the filter voltage is set by the output of a DAC based on a stored rolling average of previous voltage measurements at that delay following the trigger signal. The integration loop in this scheme has a built-in delay due to the delays involved in digitizing signal from the e-beam column of the prober, storing the digitized value in memory and applying the stored value to the filter at the next measurement at that delay. That is, real-time feedback control is not possible with this scheme. Also, the same measurement parameters are used for successive measurements at each sample point.

SUMMARY OF THE INVENTION

Since the time needed to make an accurate measurement of the DUT voltage depends on the amount by which the filter voltage Vfilter has to change to settle the loop, the measurement time can be reduced considerably if Vfilter is set before sampling to a value close to the final filter voltage value. For example, once a sample has been taken at a given delay from the trigger, the filter voltage value at the end of this sample can be used as the predicted or initial filter voltage for a successive sample or samples at the same delay from the trigger. The predicted filter voltage can be produced by retrieving from memory a digital value representing a previous sample or an average of previous samples taken at that delay from the trigger or an average of previous samples taken over some time interval or a voltage level determined from a simulation of the expected operation of the DUT or a voltage level determined by any other desired predictive scheme, and supplying the retrieved digital value to a digital-to-analog converter (DAC). The DAC supplies the predicted filter voltage Vdac. If the predictive scheme employed is reasonably accurate, then the measurement parameters can be modified to speed up the measurement without sacrificing signal-to-noise ratio.

In accordance with preferred embodiments of the invention, the filter voltage Vfilter is obtained by summing the predicted filter voltage Vdac with an integrator output voltage Vint. Vint represents the error between the predicted filter voltage Vdac and the actual filter voltage Vfilter needed to settle the loop, and is reset to zero before each successive sample. The change in Vdut (and the corresponding change in Vfilter) from sample to sample at a given sample point is mainly due to noise, surface charge-up and sampling-beam drift. Preferred embodiments of the invention use an adaptive predictive scheme in which the error between the predicted filter voltage Vdac and the actual filter voltage Vfilter for a given sample is used to update the filter voltage prediction for a later sample or samples. These and other features of the invention are disclosed in more detail below with reference to the accompanying drawing figures.

BRIEF DESCRIPTION OF THE DRAWING

FIG. 7 illustrates prior-art sampling of voltage on a buried conductor;

FIGS. 8A and 8B show waveforms on the conductor of FIG. 7, and FIG. 4B shows voltage on the dielectric of FIG. 7;

DETAILED DESCRIPTION

Figure 1:
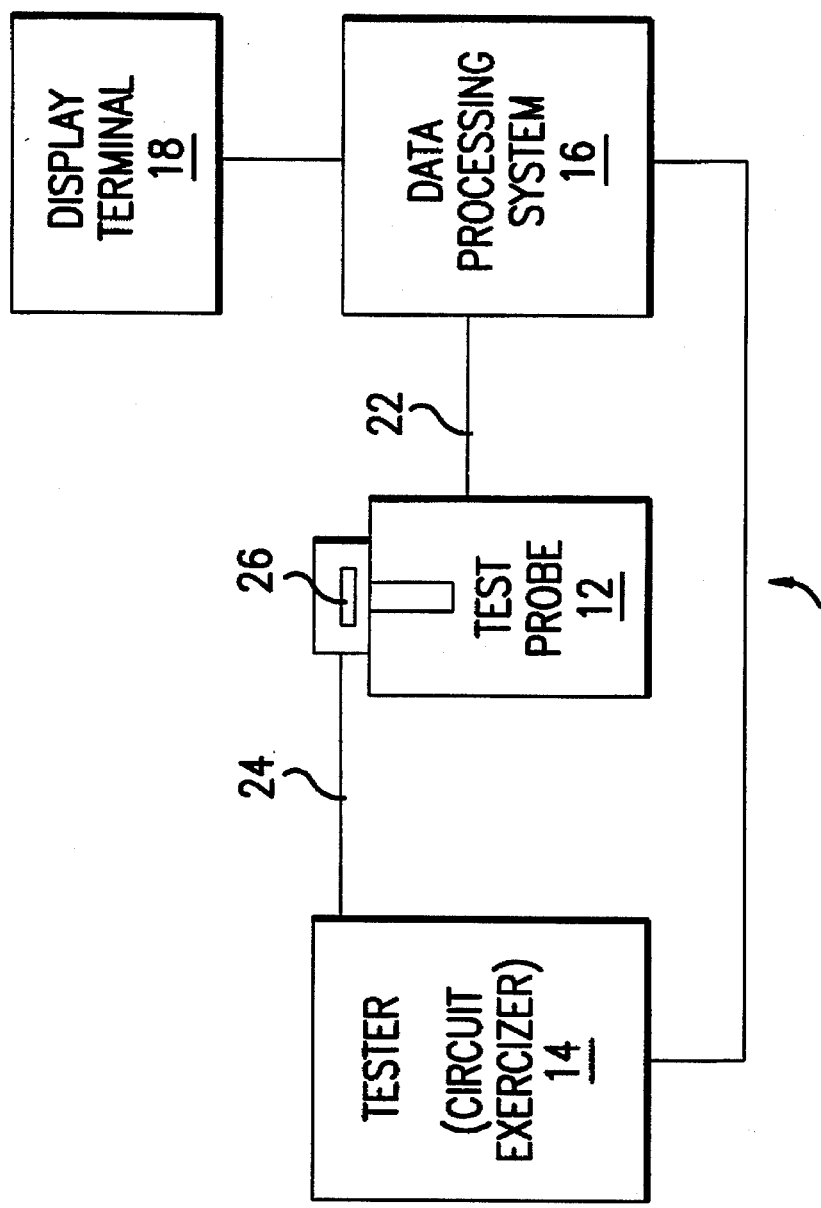
FIG. 1 shows a prior-art electron beam test probe system.
Figure 2:
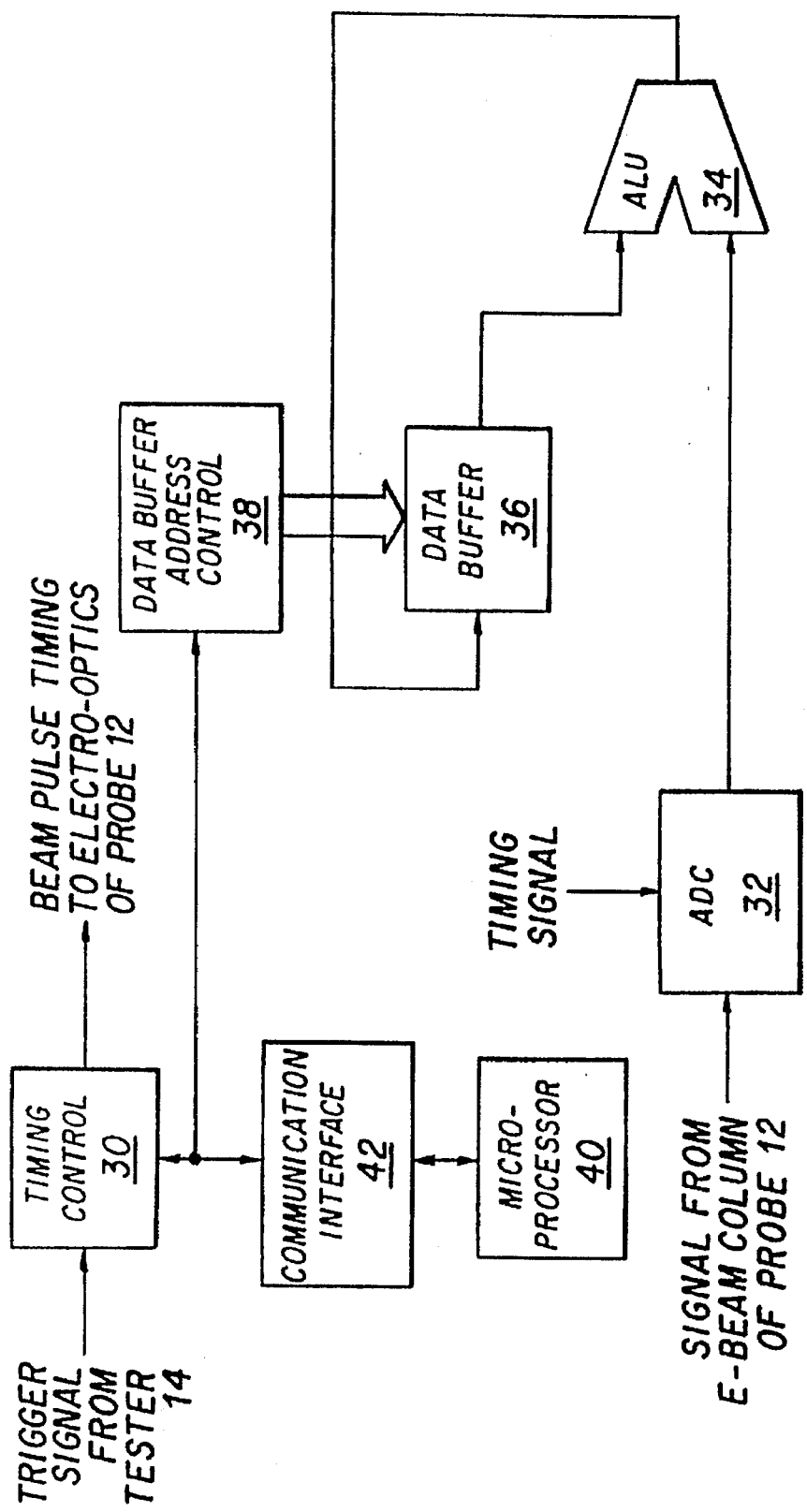
FIG. 2 is a partial functional diagram of a prior-art electron beam test probe system configured to acquire waveform images.
Figure 3:
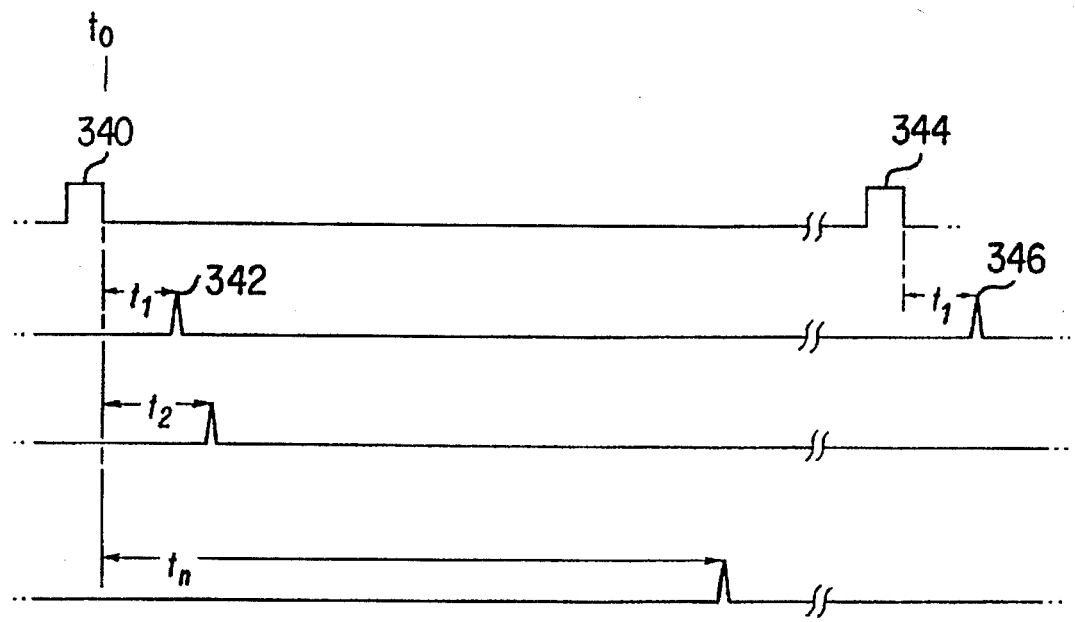
FIG. 3 is a timing diagram of a prior-art waveform acquisition scheme.
Figure 4:
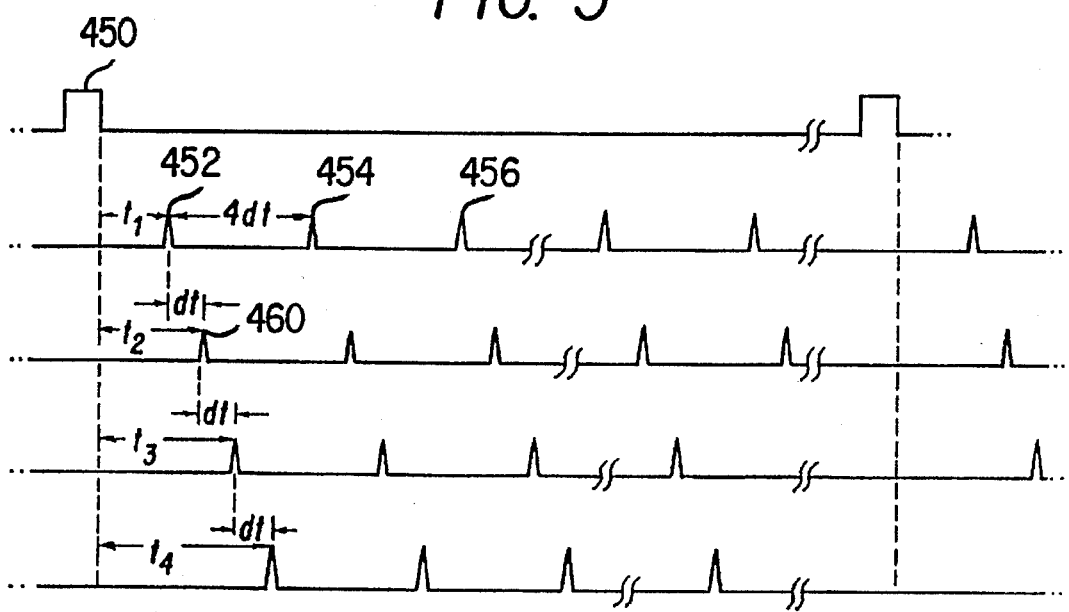
FIG. 4 is a timing diagram of a prior-art multi-sampling waveform acquisition scheme.
Figure 5:
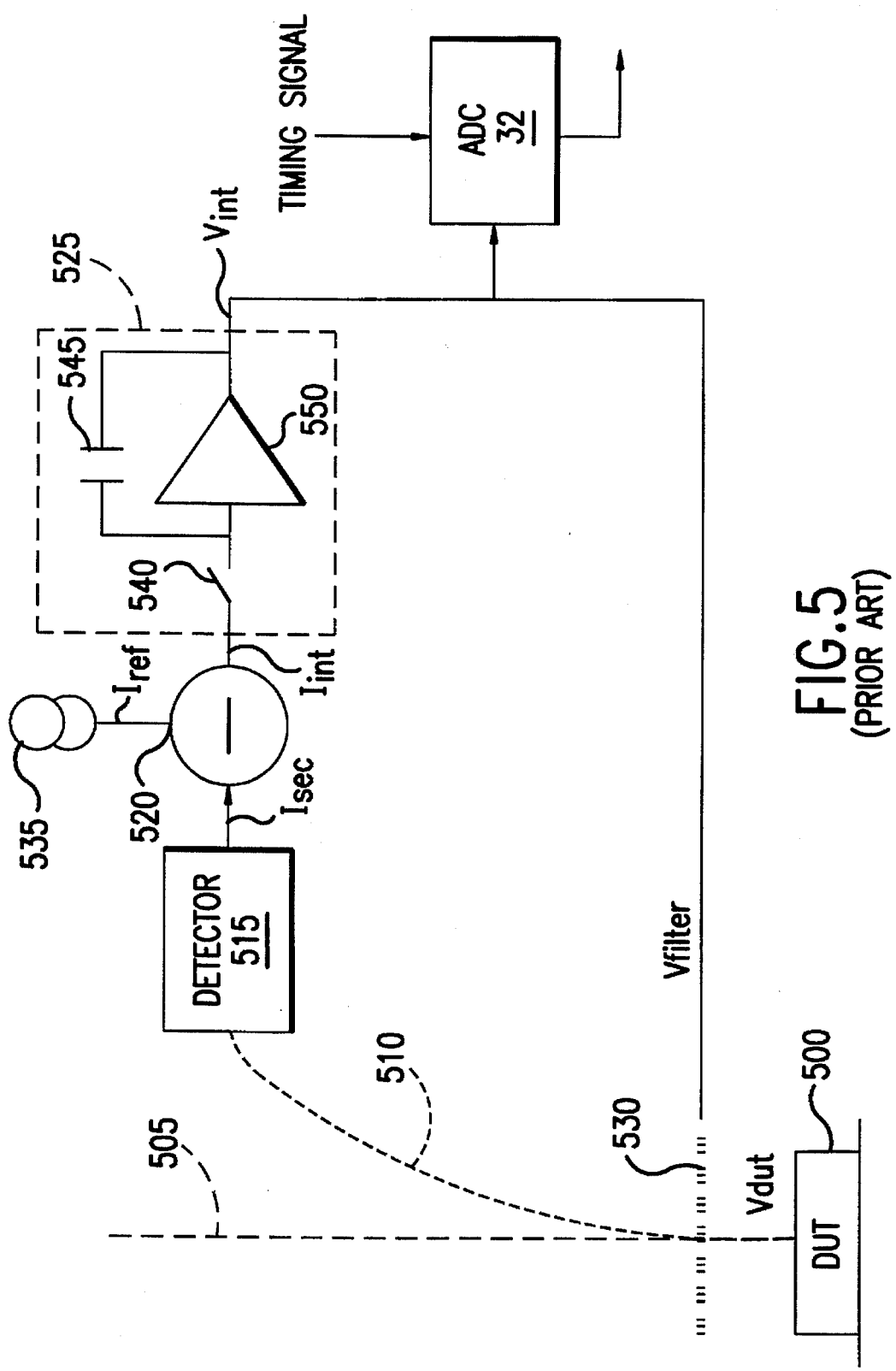
FIG. 5 schematically illustrates a prior-art waveform acquisition scheme.
Figure 6:
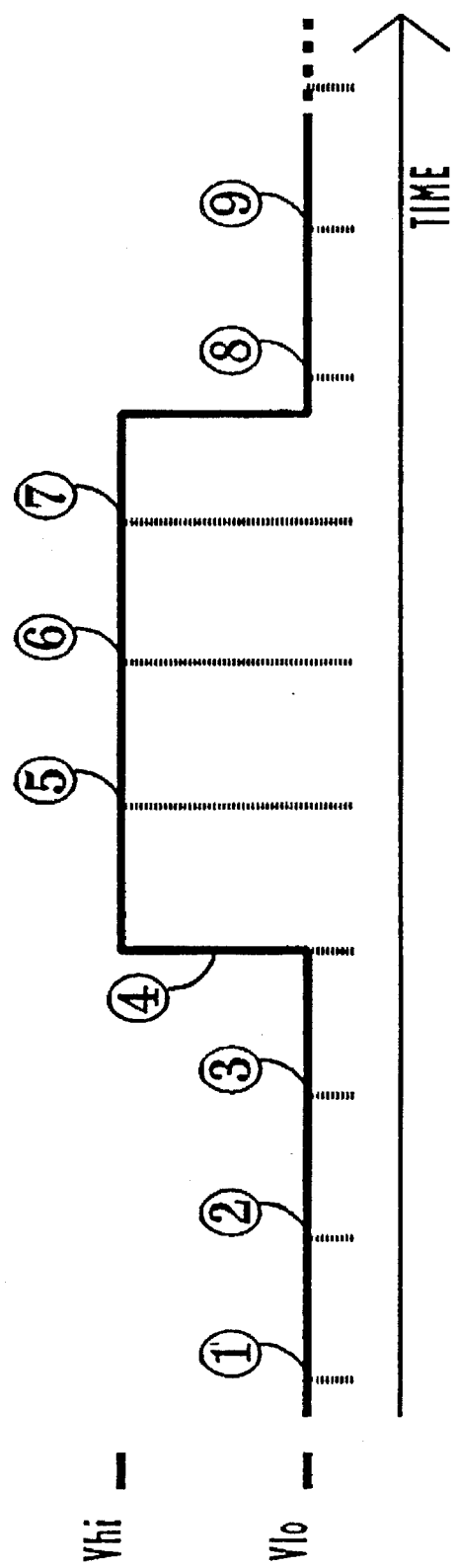
FIG. 6 illustrates prior-art linear-mode sampling.
Figure 9:
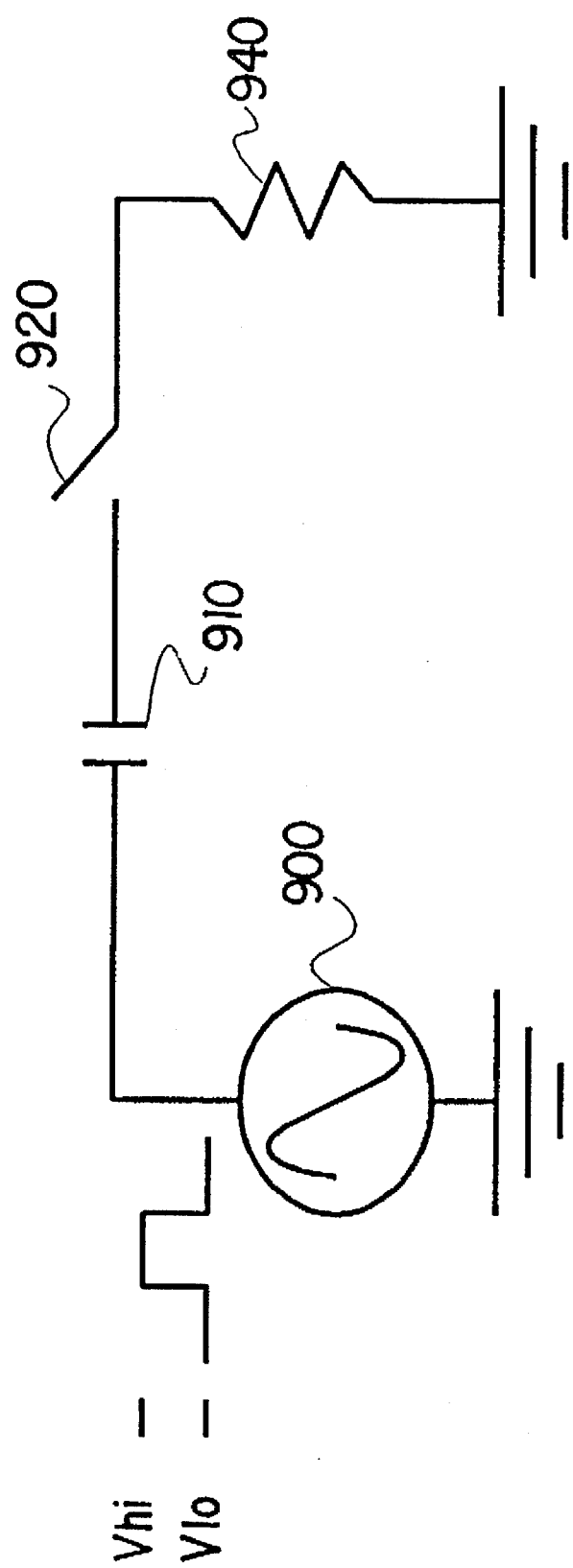
FIG. 9 shows an equivalent circuit of the arrangement of FIG. 7.
Figure 10:
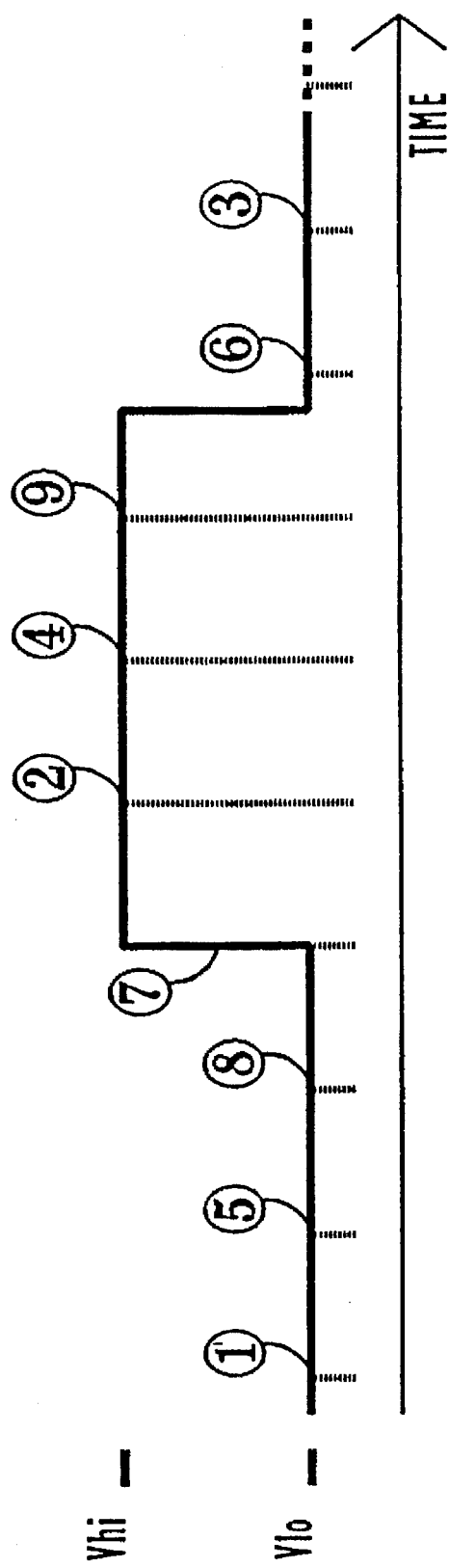
FIG. 10 illustrates prior-art random-mode sampling.
Figure 11A:
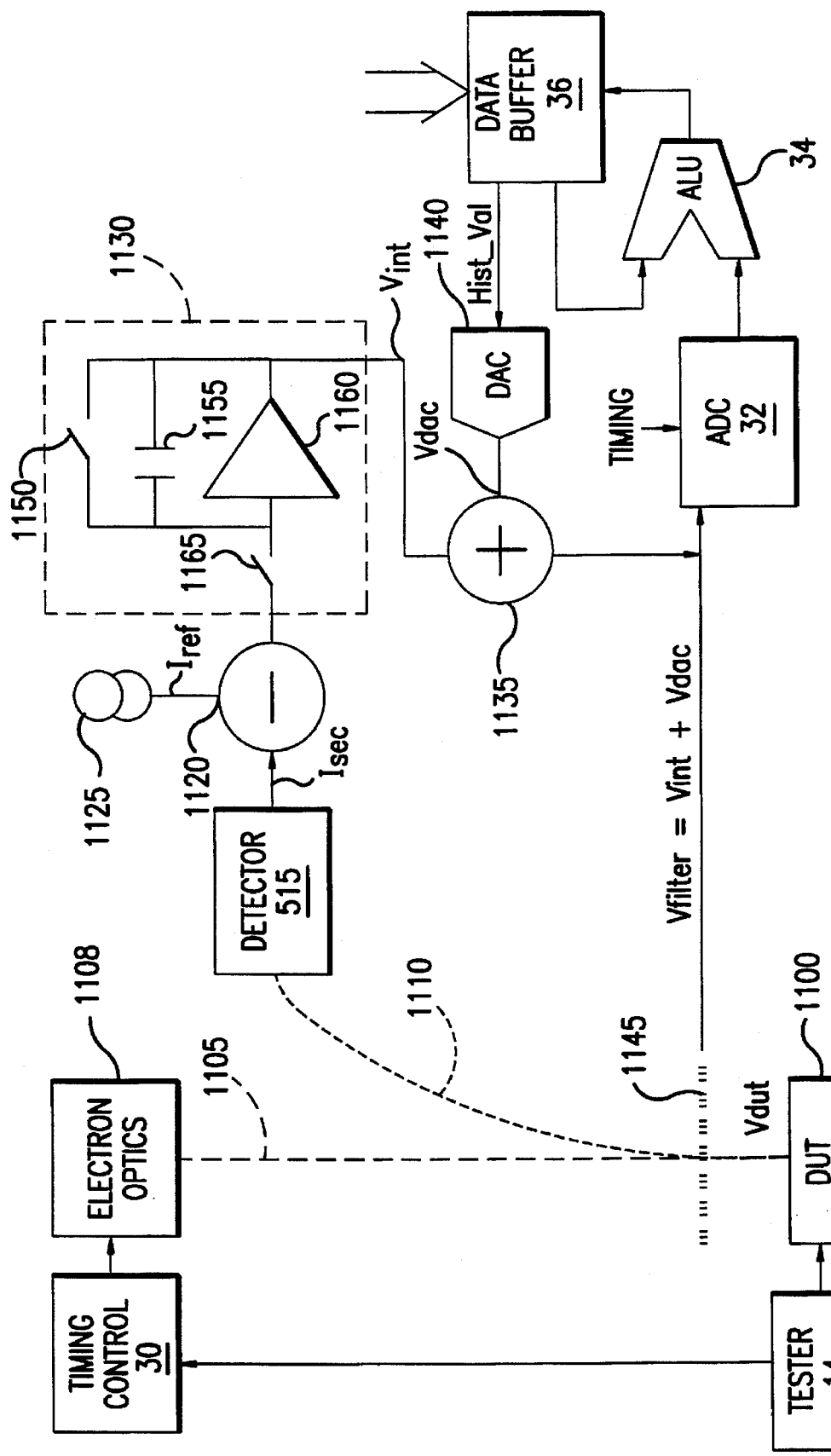
FIG. 11A illustrates schematically an arrangement for predictive waveform acquisition in accordance with the invention.

FIG. 11A shows a sampling arrangement suitable for predictive waveform acquisition in accordance with a preferred embodiment of the invention. A tester supplying a repetitive stimulus signal pattern to exercise DUT 1100 (e.g., tester 14) also generates an associated timing reference $t_0$ (e.g., trigger pulse 340) once for each repetition of the pattern. Electron beam 1105 is pulsed at some delay $t_1$ following the trigger signal for sampling the waveform on a conductor of DUT at a sample point. An electron beam pulse is produced, for example, by supplying a pulse timing signal from timing controller 30 to electro-optics 1108 of probe 12 in response to the trigger signal from tester 14. Secondary electrons 1110 emitted from the DUT are detected by a detector 1115 which supplies secondary electron current Isec. Difference amplifier 1120 produces an error signal, integrator current Iint, whose amplitude and direction depend on the difference between Isec and a reference current Iref from a constant-current source 1125. The error signal is integrated by gated integrator 1130, which supplies voltage Vint to one input of a summing amplifier (summer) 1135. A second input of summer 1135 is supplied by digital-to-analog converter (DAC) 1140 with a predicted voltage Vdac for that sample point. Vfilter, equal to the sum of Vint and Vdac, is supplied to filter grid 1145 by summer 1135.

When the DUT voltage is sampled at a chosen delay from the trigger (sample point) for the first time, Vdac may be set to zero so that the sample is acquired in the conventional manner. Imbalance between Isec and Iref produces an error signal Iint from the difference amplifier 1120 which changes the charge stored in capacitor 1155 of integrator 1130 and thus changes Vint. A change in Vint changes Vfilter, reducing the imbalance between Isec and Iref. If the loop were allowed to settle, Vfilter would change until Isec equaled Iref and the error signal from difference amplifier 1120 was zero.

Due to the loop's time constant, the loop will not usually settle during one comparison between Isec and Iref. Multiple comparisons or beam-pulses are needed to settle the loop. The number of comparisons needed to settle the loop is a function of the maximum possible change in Vfilter, the width of the sampling-beam pulse used, and the value of the capacitor. For example, when a 1 ns beam pulse width is used, the acquisition parameters in linear mode may be 1000 beam pulses per sample and a 2200 pF capacitor, while the acquisition parameters in random mode may be 2000 beam pulses per sample and a 1000 pF capacitor. For each comparison, Vfilter is convened to a digital sample value by ADC 32 and supplied to ALU 34 for weighted averaging and storage in data buffer 36.

When the DUT voltage is again sampled at the same sample point, it may be predicted that the sampled value will be identical or nearly identical to the value of the previous sample(s). Acquisition of the new sample is thus started with the filter voltage Vfilter set to the predicted value. This may be accomplished by resetting the integrator (setting Vint =0) before sampling and setting the predicted voltage Vdac to the historical value Vhist based on one or more previous samples taken at that sample point. The initial filter voltage at the start of the new sample acquisition will be Vfilter= Vdac+Vint=Vhist. If Vint is not reset to zero before the sample is taken, then Vint is initially equal to some non-zero value Vprev from the immediately previous sample acquisition. In this case, Vdac is preferably set such that Vdac= Vhist−Vprev, so that the initial filter voltage will be Vfilter= Vdac+Vint=(Vhist−Vprev)+(Vprev)=Vhist.

Figure 11B:
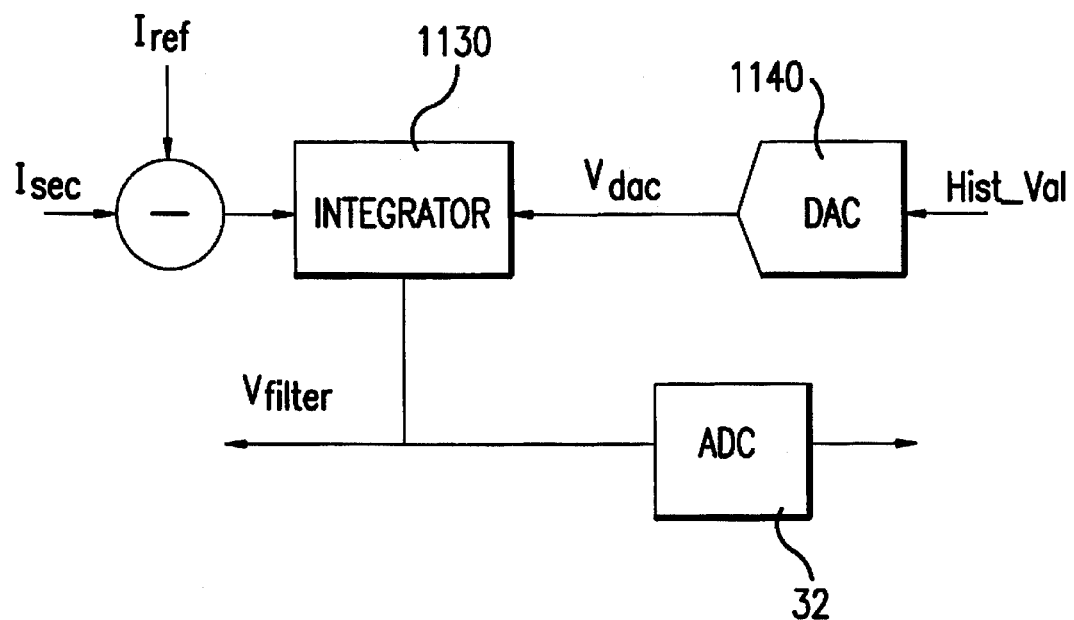
FIG. 11B shows a modification of the arrangement of FIG. 11A in accordance with the invention.

An equivalent implementation is to charge Vint to Vhist (if Vint is reset to zero) or to charge Vint to Vhist−Vprev (if Vin is not reset to zero) before each sample acquisition. In this case, summing amplifier 1135 is not needed and DAC 1140 is used to charge the integrator 1130. FIG. 11B shows a modification of the arrangement of FIG. 11A for this purpose, in which Vdac is supplied to integrator 1130, and output of integrator 1130 supplies Vfilter to filter grid 1145 and to ADC 32.

Whatever the implementation adopted, it will be seen that if the initial filter voltage is close to the final filter voltage needed to settle the loop, then the loop will settle quickly. The integrator will need only to integrate the difference between (1) Vhist and (2) the value of Vfilter needed to settle the loop. This is essentially the amount of noise, charge-up or drift inherent in the system between successive sample acquisitions at the same sample point and is typically much less than the change in Vdut from one sample point to the next sample point (especially in random mode). Hence, the acquisition parameters may be modified suitably to take advantage of the speed-up possible in the measurement time. Possible modifications include using a smaller number of beam pulses per measurement with no change in capacitor value or use of a larger capacitor with no change in number of beam pulses per measurement or a combination of both.

Assume for example that Vdut=0 V, Vfilter=−7 V and the loop is settled. Let Vdut=+5 V at the next sample point. In the traditional measurement scheme (in random mode), 2000 sampling-beam pulses per measurement may be used with a 1000 pF capacitor, since the filter voltage now must change by 5 V to settle the loop. If Vint is reset to zero and Vdac is set to +4.8 V before the sample acquisition, then the filter voltage has to change by only +0.2 V for the loop to settle. Hence, the acquisition parameters may be changed, for example, to 1000 sampling-beam pulses per measurement with a 2200 pF integrating capacitor. The waveform acquisition time is reduced (by a factor of 4 in this example) without sacrificing measurement accuracy.

The scheme of the present invention is particularly applicable to random mode because of the wider variation in the value of Vdut from one sample to the next sample in random mode. For example, for a 1 ns sampling-beam pulse width, prior-art linear mode waveform acquisition may use 1000 beam pulses per measurement and a 2200 pF capacitor while prior-art random mode waveform acquisition may use 2000 beam pulses and a 1000 pF capacitor. Also, the measurement in random mode will typically be much noisier than the measurement in linear mode. Hence, multiple measurements may need to be made and averaged in prior-art random mode signal acquisition to achieve the same signal-to-noise ratio (SNR) as in linear mode. Prior-art random mode waveform acquisition could thus be 5 to 20 times slower than prior-art linear mode waveform acquisition.

In the prior-art method of waveform acquisition, this time penalty is paid for each and every sample acquired at a given sample point. In the scheme of the present invention, this penalty is paid only once per sample point, when a measurement is done for the first time at the sample point. For subsequent measurements at that sample point, the acquisition parameters can be adjusted suitably to speed-up the sample acquisition. For example, for samples acquired at a sample point after a first sample has been aquired at that sample point, the linear mode acquisition parameters may be used instead of the random mode parameters. Using a smaller number of beam pulses per measurement also increases the accuracy of the measurement since the amount of charge deposited on the surface of the DUT is reduced.

Figure 11C:
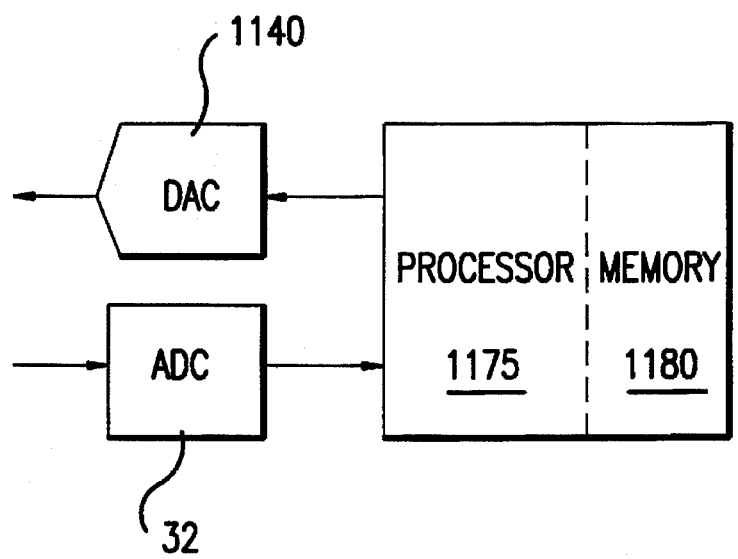
FIG. 11C shows a further modification of the arrangement of FIG. 11A in accordance with the invention.

FIG. 11C shows a further modification of the arrangement of FIG. 11A in which ALU 34 and data buffer 36 are replaced with a processor 1175 having associated memory 1180 which stores the values received from ADC 32 and supplies values (e.g., Hist_Val) to DAC 1140.

A preferred method for predictive waveform acquisition in accordance with the invention is illustrated by the following pseudo-code, in which a "delay" means a sample point at a time delay following the trigger signal from the tester, there are M measurements in a waveform image and N sweeps are acquired and averaged:

```
current_sweep_number = 1;
if (current_sweep_number <= N) {
   if (current_sweep_number == 1) {
      for measurement at a certain delay {
         use default parameters for measurement;
      }
      repeat for M delays;
   }
   if (current_sweep_number > 1) {
      for measurement at a certain delay {
         reset integrator;
         read/compute predicted value of filter
            voltage at same delay;
         set DAC to predicted filter voltage value;
         use speed-up parameters for faster measurement;
      }
      repeat for M delays;
   }
   current_sweep_number = current_sweep_number + 1;
}
```

Figure 12:
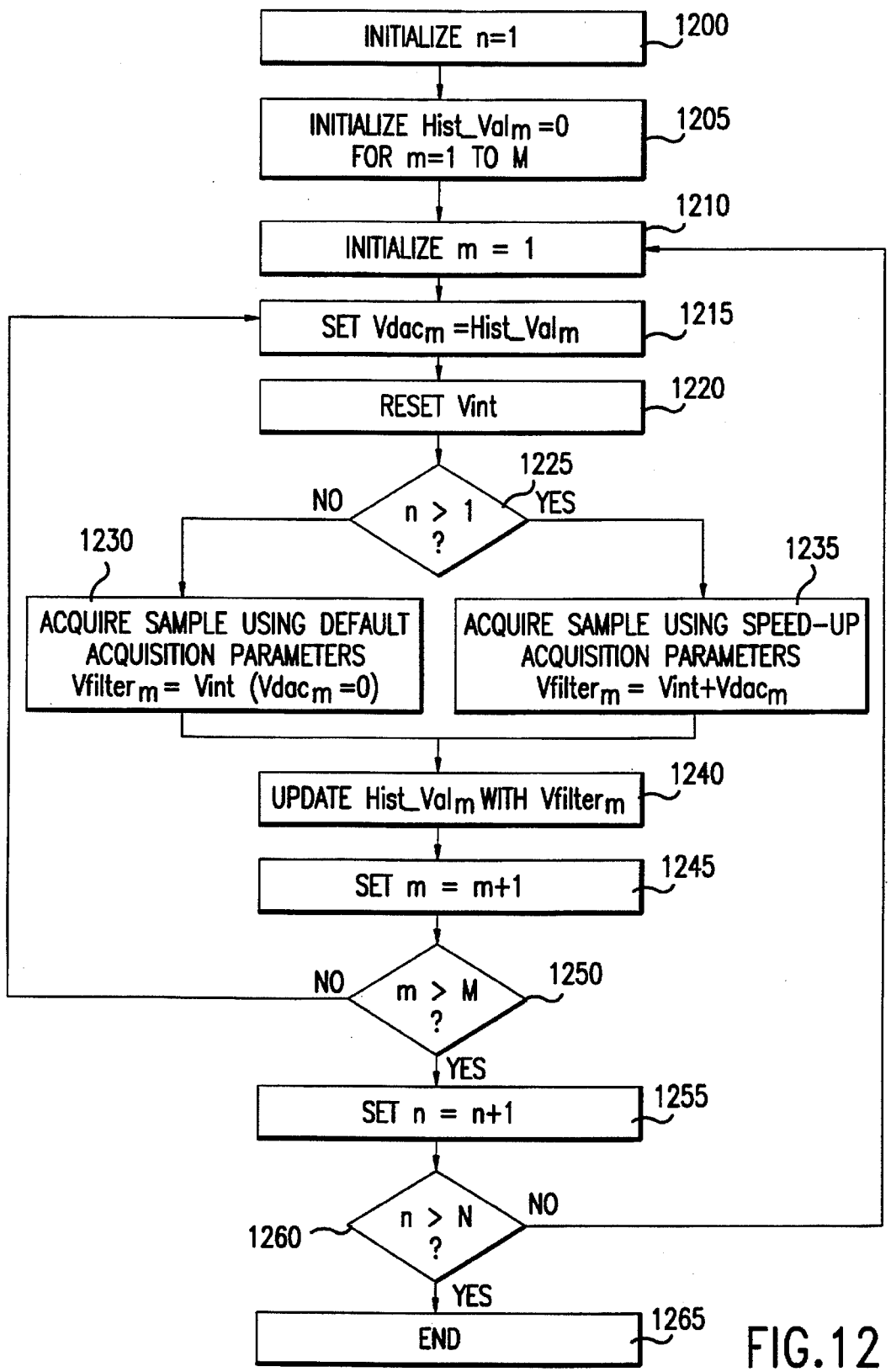
FIG. 12 is a flow chart of a preferred predictive waveform acquisition method in accordance with the invention.

A preferred method in accordance with the invention is shown in the flow chart of FIG. 12. The flow chart assumes that N sweeps are to be made and averaged, each sweep or waveform image consisting of M sample points. Step 1200 initializes the current sweep number n=1. Step 1205 initializes to zero the predicted value Hist_Val$_m$ for each sample point m=1 to M. Step 1210 initializes the current sample point m=1. Step 1215 sets voltage Vdac$_m$ for the current sample point m by supplying the predicted value Hist_Val$_m$ for that sample point to DAC 1140. In step 1220, Vint is reset to zero (e.g., by closing switch 1150). Step 1225 tests to see if the current sweep is the first sweep. If it is, control passes to step 1230 in which the current sample is acquired using the default acquisition parameters. In step 1230, the filter voltage Vfilter is solely determined by the integrator voltage Vint since Vdac will be zero during the first sweep.

If the current sweep is not the first sweep, then control passes from step 1225 to step 1235 (rather than to step 1230 as in the first sweep). For sweeps 2 to N, the filter voltage can be predicted for each sample point based on the previous measurements at that sample point. Hence, speed-up acquisition parameters can be used for the acquisition. Vfilter is determined by the sum of Vint and Vdac, where Vint is the error between the predicted filter voltage and the voltage needed to settle the loop. After the acquisition, the value of Vfilter$_m$ is supplied to ADC 32. Step 1240 updates the predicted value Hist_Val$_m$ with the value of Vfilter$_m$, such as by weighted averaging in ALU 34 and storing the updated average in data buffer 36.

Step 1245 increments the current sample point m=m+1. Step 1250 tests whether all sample points have been sampled; if not steps 1215 to 1250 are repeated for each of the sample points in succession until all have been sampled. When all sample points have been sampled, step 1255 increments the current sweep number n=n+1. Step 1260 tests whether N sweeps have been completed; if not, control passes to step 1210 to again initialize the current sample point m=1. The process continues until N sweeps have been completed, ending at step 1265.

Figure 13A:
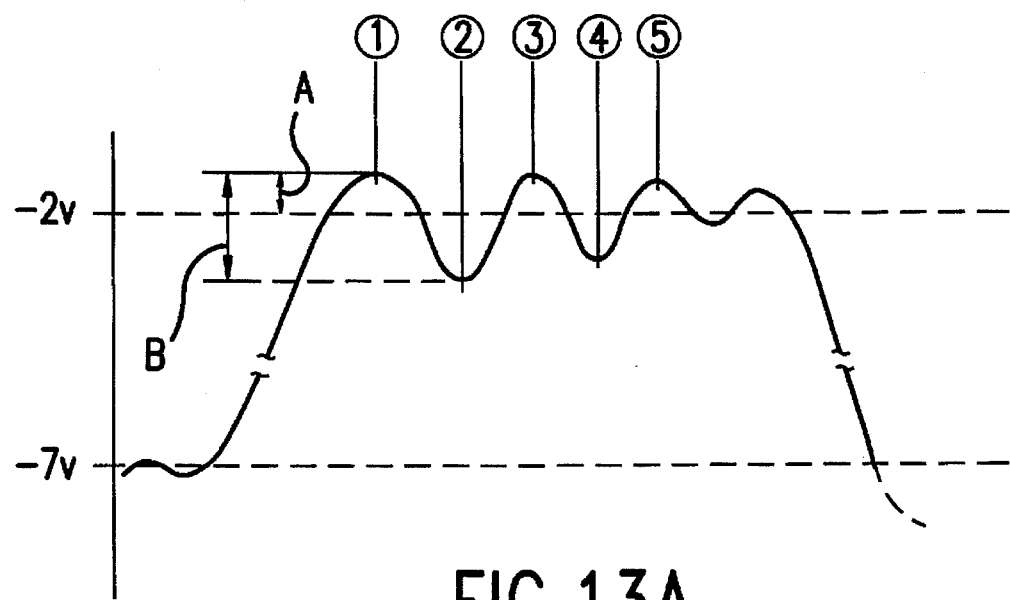
FIG. 13A illustrates how the predicted voltage can be set equal to an average of previous samples in accordance with the invention.

For either random sampling or linear sampling, the DAC can be set for any given sample point to the previously-measured filter voltage or filter voltage average for that sample point as described above. A modification of this scheme is particularly suited for linear sampling in which the filter voltage typically changes little from one sample point to the next. In this modified scheme, the DAC is set to have an output voltage equal to the average filter voltage of a plurality of sample points having about the same actual filter voltage. An example is shown in FIG. 13A. A sample point ① at which a sample is to be acquired is expected to result in a filter voltage of about −2 volts. This expected value can be determined from an actual filter voltage sample acquired previously at this sample point. An average is then taken of filter voltage samples acquired previously for all or a selected group of sample points having a measured filter voltage of about −2 volts (e.g., sample points ①,②,③,④ and ⑤). This average is then used as the predicted filter voltage for the sample point at which a new sample is to be acquired. The apparatus of FIG. 11A can be used for this purpose, with suitably modified control of ALU 34 and data buffer 36 (or with addition or substitution of other suitable structure, e.g., as in FIG. 11C).

Figure 13B:
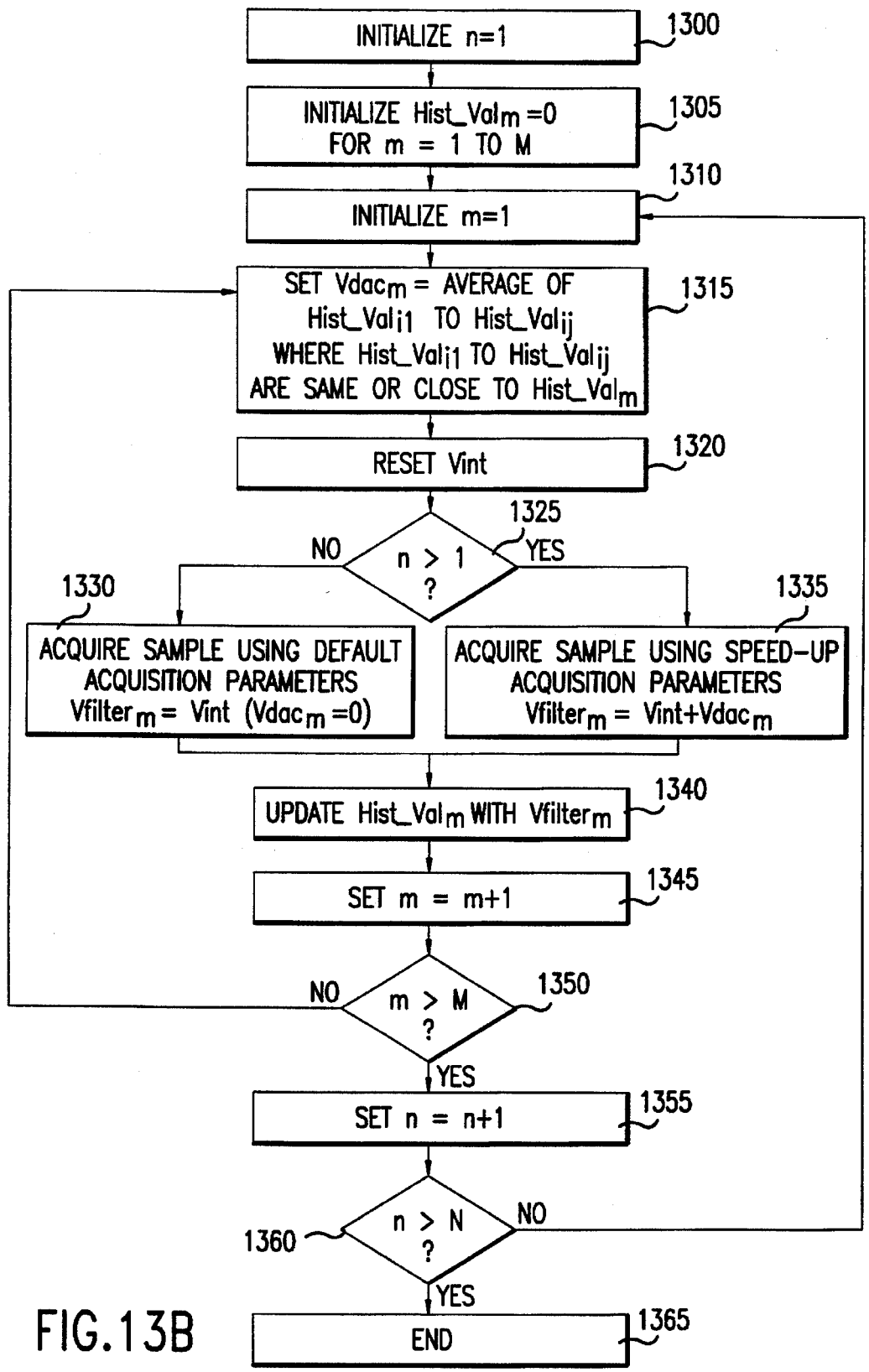
FIG. 13B is a flow chart for the method described with reference to FIG. 13A.

A flow chart for the scheme described with reference to FIG. 13A is shown in FIG. 13B. The flow chart assumes that N sweeps are to be made and averaged, each sweep being completed by acquiring samples at M successive delays (sample points) from the trigger. Step 1300 initializes the sweep number n=1. Step 1305 initializes the predicted value Hist_Val$_m$=0 for each sample point m=1 to M. Step 1310 initializes the current sample point m=1. Step 1315 sets voltage Vdac$_m$ for the current sample point by supplying a value representing the average of the predicted values Hist_Val$_{i1}$, Hist_Val$_{i2}$, . . . , Hist_Val$_{ij}$ for all sample points at which the DUT voltage is the same value or very close to the same as the DUT voltage expected at the current sample point.

For the first sweep, Vdac$_m$ for all the sample points is set to zero. Step 1320 resets the value of Vint (e.g., by closing switch 1150). Step 1325 tests whether the current sweep is the first sweep. If it is the first sweep, control passes to step 1330 in which the sample is acquired using the default acquisition parameters since there is no a priori information to predict the final value of the filter voltage. In this case, the filter voltage is determined solely by Vint. If the current sweep is not the first sweep, then control passes to step 1335 in which the sample is acquired using the speed-up acquisition parameters since the filter voltage may be predicted based on samples acquired during previous sweeps(s). In step 1335, the filter voltage is determined by the sum of Vint and Vdac$_m$. In steps 1330 and 1335, the final filter voltage Vfilter$_m$ is supplied to ADC 32. Control then passes to step 1340, where the predicted value of the sample point Hist_Val$_m$ is updated with the value of Vfilter$_m$ by, for example, weighted averaging in ALU 34 and storing the updated average in data buffer 36. Step 1345 increments the current sample point m=m+1.

Step 1350 tests whether all sample points have been sampled; if not, steps 1315 to 1350 are repeated for each of the sample points in succession until all have been sampled. When all sample points have been sampled, step 1355 increments the current sweep number n=n+1. Step 1360 tests whether N sweeps have been acquired; if not, control passes to step 1310 to again initialize the current sample point m=1. The process continues until all N sweeps have been done, ending at step 1365.

The foregoing describes schemes suitable for quantitative analog waveform acquisition. In another form of the invention particularly suited to qualitative logic signal acquisition, the DAC is set to the average of filter voltage measurements taken previously for all sample points or all sample points over some time interval. In a Schlumberger IDS system, an average filter voltage is available in the system's timebase (TB) memory for use in automatic gain control (AGC). For example, if the waveform being measured nominally varies between 0 volt and 5 volts and the filter voltage varies respectively from −7 volts to −2 volts, then the average filter voltage is −4.5 volts. The predicted filter voltage is thus taken to be −4.5 volts for all sample points and the DAC is set accordingly. The integrator's output voltage Vint will then tend to go positive for a sample point at which the nominal value of Vdut=5 volts (Vfilter=Vdac+Vint=−4.5 volts +2.5 volts =−2 volts) and tend to go negative for a sample point at which the nominal value of Vdut =0 volt (Vfilter=Vdac+Vint=−4.5 volts−2.5 volts=−7 volts). However, it is not necessary for logic signal acquisition to wait for Vint to reach the full value (e.g., +2.5 volts or −2.5 volts). It is sufficient to know the polarity of integrator output voltage Vint (+ or −), since the polarity is all one needs to determine whether the sample point being measured is a logic "high" or logic "low." In a modification of this scheme, one can monitor the polarity of integrator current Iint to distinguish logic "high" from logic "low." Also, if there is charge-up or drift phenomenon, it can be corrected by adjusting Vdac by ½(Vint$_{pos}$+Vint$_{neg}$)

where Vint$_{pos}$ is the average positive value of Vint and Vint$_{neg}$ is the average negative value of Vint.

The foregoing description of preferred embodiments of the invention is intended as illustrative only, and not as a limitation of the invention as defined by the claims which follow. Those of skill in the art will recognize many modifications which may be made in the preferred embodiments within the spirit and scope of the claimed invention.

For example, the predicted filter voltage need not be prepared by supplying a digital value to a DAC, but can be supplied from a controllable analog voltage source. The filter voltage need not be predicted from a prior measurement or an average of prior measurements, but can instead be predicted from a simulation of the expected operation of the DUT or from any other desired source.

We claim:

1. A method of operating a charged-particle-beam prober to acquire data representing voltages of a waveform on a node of a circuit, comprising:

a. applying to the circuit a stimulus signal pattern having an associated timing reference $t_0$;
b. acquiring a voltage sample at a selected delay $t_i$ following the timing reference, by
   i. setting a predicted voltage (Vdac) based on a previously stored value;
   ii. summing the predicted voltage (Vdac) with an integrator voltage (Vint) to produce a filter voltage (Vfilter);
   iii. applying the filter voltage to a grid situated between the node and a detector;
   iv. applying to the node a charged-particle-beam pulse at the selected delay $t_i$ following the timing reference;
   v. detecting secondary charged-particles passing through the grid to produce a detector current (Isec);
   vi. combining the detector current with a reference current (Iref) to produce an integrator current (Iint), such that the integrator current is zero when the filter voltage is in a predetermined relationship to voltage on the node;
   vii. integrating the integrator current over a time interval to produce the integrator voltage; and
   viii. storing a value representing the filter voltage for use in setting the predicted voltage when acquiring a subsequent voltage sample; and
repeating steps a. and b. a plurality of times, to acquire a voltage sample at a selected delay $t_i$ upon each repetition of the stimulus signal pattern.

2. The method of claim 1, further comprising the step of varying the selected delay $t_i$ from one repetition of the stimulus signal pattern to the next and wherein, upon each repetition of the stimulus signal pattern, step b.i. comprises setting the predicted voltage based on a value stored during acquisition of a previous voltage sample at the selected delay $t_i$ following the timing reference.

3. The method of claim 2, wherein varying the selected delay $t_i$ comprises pseudo-randomly selecting a delay $t_i$ from a range of delays $t_1-t_n$.

4. The method of claim 2, wherein varying the selected delay $t_i$ comprises selecting a delay $t_i$ from a range of delays $t_1-t_n$ in sequential order from $t_1-t_n$.

5. The method of claim 1, further comprising the step of resetting the integrator voltage before acquiring the voltage sample.

6. The method of claim 1, wherein step b.i. comprises setting the predicted voltage (Vdac) equal to a voltage sample acquired at the same selected delay $t_i$ during a previous repetition of the stimulus signal pattern.

7. The method of claim 1, wherein step b.i. comprises setting the predicted voltage (Vdac) equal to the difference between (1) the voltage sample acquired during the immediately preceding repetition of the stimulus signal pattern and (2) a voltage sample acquired at the same selected delay $t_i$ during a previous repetition of the stimulus signal pattern.

8. The method of claim 1, wherein step b.i. comprises setting the predicted voltage (Vdac) equal to the average of a plurality of previously-acquired filter voltage samples.

9. The method of claim 8, wherein said plurality of previously-acquired filter voltage samples comprise filter voltage samples acquired at a plurality of selected delays $t_i$.

10. A charged-particle-beam probe system for acquiring data representing voltages of a waveform on a node of a circuit when a stimulus signal pattern having an associated timing reference $t_0$ is repeatedly applied to the circuit, comprising:
a. a predicted-voltage source for supplying a predicted voltage (Vdac) based on a previously stored value;
b. a summer for summing the predicted voltage (Vdac) with an integrator voltage (Vint) to produce a filter voltage (Vfilter);
c. a grid connected to be charged with the filter voltage and situated between the node and a detector;
d. a beam source for applying to the node a charged-particle-beam pulse at a selected delay $t_i$ following the timing reference;
e. a detector for detecting secondary charged-particles passing through the grid to produce a detector current (Isec);
f. a current-combining circuit for combining the detector current with a reference current (Iref) to produce an integrator current (Iint), such that the integrator current is zero when the filter voltage is in a predetermined relationship to voltage on the node;
g. an integrator for integrating the integrator current over a time interval to produce the integrator voltage; and
h. a processor with associated memory for storing a value representing the filter voltage for use in setting the predicted voltage when acquiring a subsequent voltage sample.

11. The apparatus of claim 10, wherein the predicted-voltage source comprises a digital-to-analog converter connected to receive a stored value from the processor with associated memory and for supplying the predicted voltage to the summer.

12. The apparatus of claim 10, wherein the summer comprises a summing amplifier having a first input connected to receive the integrator voltage, a second input connected to receive the predicted voltage, and an output for supplying the filter voltage to the grid.

13. The apparatus of claim 10, wherein the integrator comprises a controllable operator for resetting the integrator voltage.

14. The apparatus of claim 10, wherein the integrator comprises a capacitor, and a controllable switch for discharging the capacitor to reset the integrator voltage.

15. A method of operating a charged-particle-beam prober to acquire data representing voltages of a waveform on a node of a circuit, comprising:
a. applying to the circuit a stimulus signal pattern having an associated timing reference $t_0$;
b. acquiring a sample at a selected delay $t_i$ following the timing reference, by
   i. setting a predicted voltage (Vdac) based on at least one previously stored value;
   ii. summing the predicted voltage (Vdac) with an integrator voltage (Vint) to produce a filter voltage (Vfilter);
   iii. applying the filter voltage to a grid situated between the node and a detector;
   iv. applying to the node a charged-particle-beam pulse at the selected delay $t_i$ following the timing reference;
   v. detecting secondary charged-particles passing through the grid to produce a detector current (Isec);
   vi. combining the detector current with a reference current (Iref) to produce an integrator current (Iint), such that the integrator current is zero when the filter voltage is in a predetermined relationship to voltage on the node;
   vii. integrating the integrator current over a time interval to produce the integrator voltage; and
   viii. storing a value representing the filter voltage and a value representing the detector current for use in setting the predicted voltage when acquiring a subsequent sample; and c. repeating steps a. and b. a plurality of times, to acquire a sample at a selected delay $t_i$ upon each repetition of the stimulus signal pattern.

16. The method of claim 15, wherein a first performance of step b.i. comprises setting the predicted voltage (Vdac) equal to an initial voltage (Vinitial).

17. The method of claim 16, wherein a subsequent performance of step b.i. comprises changing the predicted voltage (Vdac) based on the detector current (Isec) of a prior performance of step b.vi.

18. A charged-particle-beam probe system for acquiring data representing voltages of a waveform on a node of a circuit when a stimulus signal pattern having an associated timing reference $t_0$ is repeatedly applied to the circuit, comprising:

a. a predicted-voltage source for supplying a predicted voltage (Vdac) based on at least one previously stored value;

b. a summer for summing the predicted voltage (Vdac) with an integrator voltage (Vint) to produce a filter voltage (Vfilter);

c. a grid connected to be charged with the filter voltage and situated between the node and a detector;

d. a beam source for applying to the node a charged-particle-beam pulse at a selected delay $t_i$ following the timing reference;

e. a detector for detecting secondary charged-particles passing through the grid to produce a detector current (Isec);

f. a current-combining circuit for combining the detector current with a reference current (Iref) to produce an integrator current (Iint), such that the integrator current is zero when the filter voltage is in a predetermined relationship to voltage on the node;

g. an integrator for integrating the integrator current over a time interval to produce the integrator voltage; and h. a store for storing a value representing the filter voltage and a value representing the detector current for use in setting the predicted voltage when acquiring a subsequent voltage sample.

19. The apparatus of claim 18, wherein the predicted-voltage source comprises a digital-to-analog converter connected to receive a stored value from the store and for supplying the predicted voltage to the summer.

20. The apparatus of claim 18, wherein the summer comprises a summing amplifier having a first input connected to receive the integrator voltage, a second input connected to receive the predicted voltage, and an output for supplying the filter voltage to the grid.

21. The apparatus of claim 18, wherein the integrator comprises a controllable operator for resetting the integrator voltage.

22. The apparatus of claim 18, wherein the integrator comprises a capacitor, and a controllable switch for discharging the capacitor to reset the integrator voltage.

23. The apparatus of claim 18, further comprising a current detector responsive to the detector current for supplying to the store said value representing the detector current.

24. A method of operating a charged-particle-beam prober to acquire data representing voltages of a waveform on a node of a circuit, comprising:

a. applying to the circuit a stimulus signal pattern having an associated timing reference $t_0$;

b. acquiring a voltage sample at a selected delay $t_i$ following the timing reference, by i. setting a filter voltage (Vfilter) equal to a predicted value;

ii. applying the filter voltage to a grid situated between the node and a detector;

iii. applying to the node a charged-particle-beam pulse at the selected delay $t_i$ following the timing reference;

iv. detecting secondary charged-particles passing through the grid;

v. producing a current signal based on the detected secondary charged-particles;

vi. integrating the current signal to measure an error voltage representing a difference between said predicted value of the filter voltage and an actual value;

vii. updating said predicted value by said error voltage; and c. repeating steps a. and b. a plurality of times, to acquire a voltage sample at a selected delay $t_i$ upon each repetition of the stimulus signal pattern.

25. A charged-particle-beam probe system for acquiring data representing voltages of a waveform on a node of a circuit when a stimulus signal pattern having an associated timing reference $t_0$ is repeatedly applied to the circuit, comprising:

a. a circuit (1135, 1140) responsive to a processor with associated memory for setting a filter voltage (Vfilter) equal to a predicted value;

b. a grid connected to be charged with the filter voltage and situated between the node and a detector;

c. a detector for detecting secondary charged-particles passing through the grid to produce a current signal;

d. an integrator for integrating the current signal to produce an error voltage representing a difference between said predicted value and an actual value; and e. a processor with associated memory responsive to the error voltage for resetting the filter voltage each time the stimulus signal pattern is applied to the circuit.

26. The system of claim 25, wherein the integrator includes a controllable element (1150) for resetting the error voltage.

27. The system of claim 25, wherein said circuit comprises a digital-to-analog converter for supplying a first voltage (Vdac) to a summer, and a summer for summing the first voltage with the error voltage to produce the filter voltage.

28. The system of claim 27, wherein the digital-to-analog converter is responsive to a value supplied by the processor for supplying said first voltage.

29. The system of claim 25, further comprising a digital-to-analog converter for resetting the error voltage.

30. The system of claim 29, wherein the digital-to-analog converter is responsive to a value supplied by the processor for resetting the error voltage.

* * * * *